(12) United States Patent
Ando

(10) Patent No.: US 7,675,351 B2
(45) Date of Patent: Mar. 9, 2010

(54) FREQUENCY OUTPUT CIRCUIT

(75) Inventor: Ryo Ando, Hitachinaka (JP)

(73) Assignee: Hitachi, Ltd., Tokyo (JP)

(*) Notice: Subject to any disclaimer, the term of this patent is extended or adjusted under 35 U.S.C. 154(b) by 488 days.

(21) Appl. No.: 11/107,905

(22) Filed: Apr. 18, 2005

(65) Prior Publication Data

US 2005/0237095 A1    Oct. 27, 2005

(30) Foreign Application Priority Data

Apr. 21, 2004    (JP) .............................. 2004-125316

(51) Int. Cl.
*G05F 1/10*    (2006.01)

(52) U.S. Cl. ....................... 327/538; 327/540

(58) Field of Classification Search ........................ None
See application file for complete search history.

(56) References Cited

U.S. PATENT DOCUMENTS

| | | | |
|---|---|---|---|
| 4,264,873 A | | 4/1981 | Kominami et al. |
| 5,572,162 A | | 11/1996 | Cotreau |
| 5,610,557 A | | 3/1997 | Jett, Jr. |
| 5,787,132 A | * | 7/1998 | Kishigami et al. .......... 375/354 |
| 5,994,962 A | | 11/1999 | Watanabe et al. |
| 6,150,885 A | | 11/2000 | Ashby et al. |
| 6,462,688 B1 | | 10/2002 | Sutardja |
| 6,545,540 B1 | | 4/2003 | Enriquez |
| 7,023,181 B2 | * | 4/2006 | Nakata ........................ 322/28 |
| 7,042,270 B2 | * | 5/2006 | Fujikawa .................... 327/333 |
| 7,151,365 B2 | * | 12/2006 | Nakata ....................... 323/314 |
| 7,298,203 B2 | * | 11/2007 | Wang et al. ..................... 330/9 |
| 7,414,456 B2 | * | 8/2008 | Bowers ...................... 327/538 |
| 2005/0237095 A1 | * | 10/2005 | Ando .......................... 327/172 |
| 2006/0279269 A1 | * | 12/2006 | Yang .......................... 323/313 |
| 2007/0016664 A1 | * | 1/2007 | Ewing et al. ................. 709/223 |

FOREIGN PATENT DOCUMENTS

| | | |
|---|---|---|
| JP | 03-065715 | 3/1991 |
| JP | 05-211431 | 8/1993 |
| JP | 06-077746 | 3/1994 |
| JP | 2001-211047 | 8/2001 |
| JP | 2003-115757 | 4/2003 |
| WO | 97/42554 | 11/1997 |

OTHER PUBLICATIONS

Meyer, R.G. et al "The Differential Pair as a Triangle-Sine Wave Converter", IEEE Journal of Solid State Circuits, Jun. 1976, pp. 418-420.
May 13, 2008 foreign Office Action with English translation.

* cited by examiner

*Primary Examiner*—Tuan Lam
*Assistant Examiner*—Hiep Nguyen
(74) *Attorney, Agent, or Firm*—Mattingly & Malur, P.C.

(57) ABSTRACT

Unwanted electromagnetic waves are eliminated in a frequency output circuit comprising an open-collector output terminal whereby radio noise can be reduced. A frequency output circuit 10 comprises an open-collector transistor Q4 with an open-collector output terminal connected to a pull-up resistor Rf connected to an external power supply Vex. A current limiting circuit 16 limits a current through the output terminal such that a high potential and a low potential of the output waveform of a frequency signal outputted by an output circuit 12 are smoothly switched. The current limiting circuit 16 is formed by a differential pair circuit of transistors Q1 and Q2 each with a resistor provided in the emitter thereof, and a current mirror circuit comprising an open-collector transistor, for example.

6 Claims, 8 Drawing Sheets

FREQUENCY OUTPUT CIRCUIT

BACKGROUND OF THE INVENTION

1. Field of the Invention

The present invention relates to a frequency output circuit for outputting a frequency signal, and, in particular, to a frequency output circuit comprising an open-collector output terminal.

2. Background Art

In order to reduce the emission of unwanted electromagnetic radiation from a frequency output circuit, the circuit should ideally output a sine wave. JP Patent Publication (Kokai) No. 2001-211047 A discloses that, in the case of a rectangular wave oscillator that is not of the open-collector output configuration, a rectangular wave is shaped to be closer to a sine wave using an inductor and a capacitor such that the unwanted electromagnetic radiation can be eliminated.

In frequency output circuits with an open-collector output terminal, the transistor on the output end is turned on or off and the signal voltage is received from an external power supply, such that the waveform that is outputted is basically a rectangular wave. When the output voltage occurs in the form of a rectangular wave, the current also flows through a rectangular wave. As a result, a high-frequency electromagnetic wave is emitted, which can have an influence on radios in terms of noise.

Therefore, in some known examples of the frequency output circuit with an open-collector output terminal, a current mirror circuit is provided whereby the current that flows through the open collector is limited.

Patent Document 1: JP Patent Publication (Kokai) No. 2001-211047 A

SUMMARY OF THE INVENTION

However, in the frequency output circuit with an open-collector output terminal that is provided with a current mirror circuit, a current limit cannot be provided when the voltage increases. Even when the voltage decreases, the voltage change is not smooth, making it impossible to completely eliminate unwanted electromagnetic waves.

Meanwhile, in North America and Italy, there is a movement toward lowering the lowest AM radio frequency from the current 450 kHz to 150 kHz so as to expand the AM band. It has been found, however, that if the AM frequency is thus lowered, the unwanted electromagnetic waves emitted from the frequency output circuit with an open-collector output terminal, which previously had not been an issue, could provide radio noise.

It is therefore an object of the present invention to provide a frequency output circuit with an open-collector output terminal whereby unwanted electromagnetic waves can be eliminated and radio noise can be reduced.

In order to achieve the aforementioned object, the invention provides:

(1) A frequency output circuit comprising an open-collector output terminal connected to a pull-up resistor connected to an external power supply, the circuit outputting a frequency signal via the output terminal, the circuit further comprising:

a current limiting circuit for limiting a current that flows through the output terminal such that a high potential and a low potential of an output waveform outputted via the output terminal are smoothly switched.

This configuration eliminates unwanted electromagnetic waves in a frequency output circuit with an open-collector output terminal, thereby reducing radio noise.

(2) Preferably, in (1), the current limiting circuit comprises a differential pair circuit of transistors each with a resistor provided in the emitter thereof, and a current mirror circuit comprising an open-collector transistor.

(3) Preferably, in (1), the current limiting circuit comprises a current mirror circuit including a low-pass filter formed by a capacitor and a resistor.

(4) Preferably, in (2) or (3), the transistors forming the current mirror circuit in the current limiting circuit each comprise an adjusting resistor in the emitter thereof.

(5) Preferably, in (2), signals inputted to the differential pair circuit of the current limiting circuit comprise a triangular wave voltage signal with the same frequency as that of an output signal, and a constant voltage signal with a value between the maximum voltage value and the minimum voltage value of the triangular wave.

(6) Preferably, in (2), signals inputted to the differential pair circuit of the current limiting circuit comprise two kinds of triangular wave voltage signals with the same frequency as that of an output signal and with different amplitudes.

(7) Preferably, in (2), the differential pair circuit of the current limiting circuit comprises a low-pass filter formed by a capacitor and a resistor at a signal input terminal thereof.

(8) Preferably, in (3), an input signal current inputted to the current mirror circuit in the current limiting circuit comprises a triangular wave signal.

(9) Preferably, in (3), the waveform of an input signal current inputted to the current mirror circuit in the current limiting circuit comprises the waveform of a rectangular wave that has been passed through the low-pass filter.

(10) Preferably, in (1), there is further provided a pull-up resistor connected to the open-collector output terminal and also connected to an internally provided reference power supply.

In accordance with the invention, unwanted electromagnetic waves can be eliminated in a frequency output circuit with an open-collector output terminal, so that radio noise can be reduced.

DESCRIPTION OF THE PREFERRED EMBODIMENTS

Hereafter, the frequency output circuit according to a first embodiment of the present invention will be described with reference to FIGS. 1 to 4.

Initially referring to FIGS. 1 and 2, the configuration and operation of the frequency output circuit of the present embodiment will be described.

Figure 1:
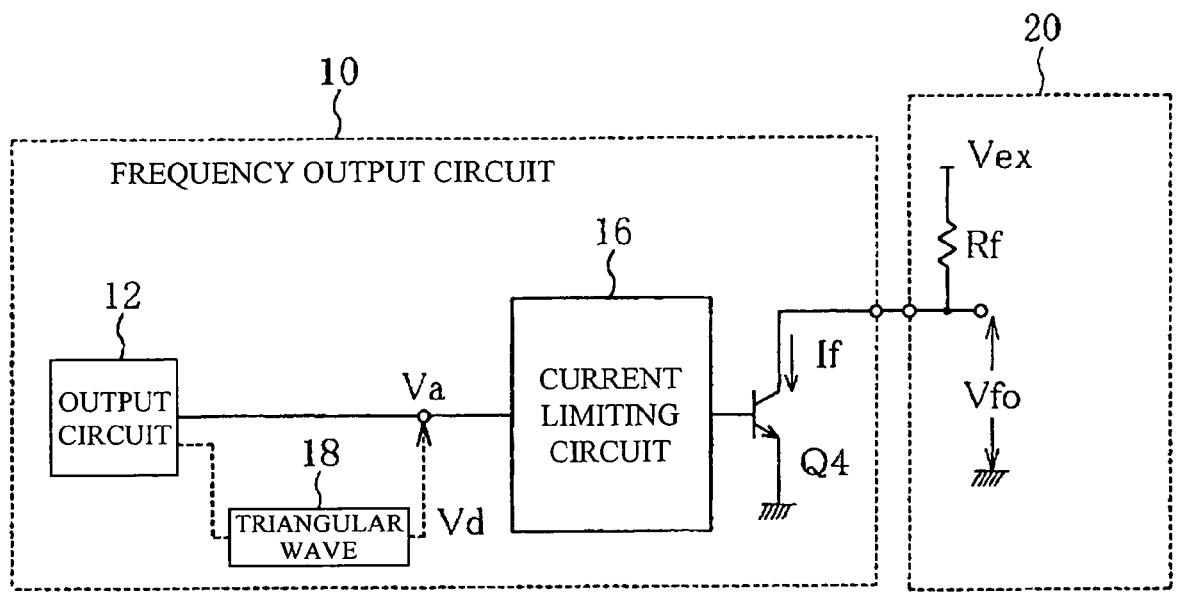
FIG. 1 shows a circuit diagram illustrating the configuration of a frequency output circuit according to a first embodiment of the invention.

FIG. 1 shows a circuit diagram illustrating the configuration of the frequency output circuit according to the first embodiment of the present invention. FIG. 2 shows an output characteristics chart of the frequency output circuit of the first embodiment of the present invention.

A frequency output circuit 10 comprises an output circuit 12, a current limiting circuit 16, and an open-collector transistor Q4. A triangular wave generating circuit 18 will be described later. The output circuit 12 measures airflow rate, for example, as does a frequency output-type airflow meter, and produces output that varies depending on the airflow rate. Obviously, the output circuit 12 may be any device whose output is of the frequency type, other than an airflow meter.

The output terminal of the frequency output circuit 10 is the collector of the open-collector transistor Q4. The collector of transistor Q4 is connected to an external power supply Vex of a signal-receiving external circuit 20 via a pull-up resistor Rf. Conventional frequency output circuits are not provided with current limiting circuit 16. Instead, transistor Q4 is turned ON and OFF using a frequency signal Va outputted by the output circuit 12. When transistor Q4 is ON, an output current If flows through the collector of transistor Q4, producing an output voltage Vfo, which is expressed by the following equation (1) and which is on the lower potential side of the frequency output waveform:

$$Vfo = Vex - Rf \times If \quad (1)$$

When transistor Q4 is OFF, no current flows through the collector of transistor Q4, so that the output voltage Vfo becomes equal to Vex, which is on the higher voltage side of the frequency output waveform. Thus, the output voltage Vfo takes the form of a rectangular wave, leading to the emission of high-frequency electromagnetic wave radiation.

In contrast, in accordance with the present embodiment, there is a current limiting circuit 16 provided between the output circuit 12 and transistor Q4. The current limiting circuit 16 causes the output voltage Vfo of the frequency output circuit 10 to have a waveform that is close to a sine wave in which harmonics components have been eliminated from the rectangular frequency output waveform, as shown in FIG. 2. The current limiting circuit 16 limits the output current If that flows through transistor Q4 such that it does not change sharply.

Now referring to FIGS. 3 and 4, the circuit configuration and operation of the current limiting circuit 16 will be described.

Figure 3:
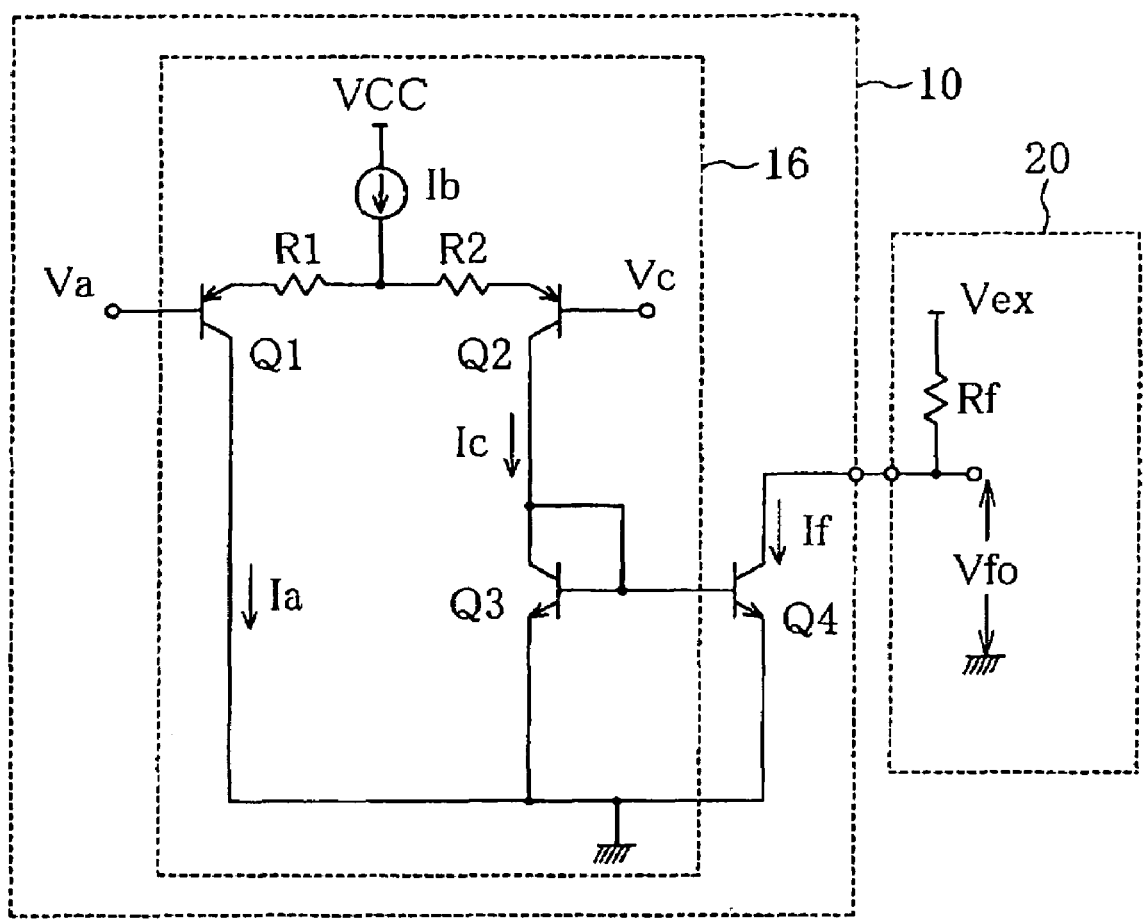
FIG. 3 shows a circuit diagram illustrating the configuration of a current limiting circuit 16 used in the frequency output circuit of the first embodiment.

FIG. 3 shows a circuit diagram illustrating the configuration of the current limiting circuit 16 used in the frequency output circuit according to the first embodiment of the invention. FIG. 4 shows the characteristics of the frequency output circuit in the first embodiment of the invention during current limitation. Similar reference characters indicate similar elements in FIGS. 1 and 3.

The current limiting circuit 16 comprises a differential pair of transistors Q1 and Q2, with the gain lowered by providing resistors R1 and R2 to the emitters thereof, and a transistor Q3 that forms a current mirror circuit with the open-collector transistor Q4. A signal Va that is fed to transistor Q1 is a frequency signal. To transistor Q2, a constant potential Vc between a maximum potential and a minimum potential of the frequency signal Va is fed. Assuming that the currents that flow in the collectors of transistor Q1 and transistor Q2 are Ia and Ic, respectively, and when R1=R2=Ra, the current that flows through the differential pair will be described.

To the differential pair of transistor Q1 and Q2, a bias current Ib is applied. When Va<<Vc, the bias current Ib flows through transistor Q1. When Va=Vc, a current of Ib/2 flows through transistor Q1 and transistor Q2 individually. When Va>>Vc, the bias current Ib flows through transistor Q2. Since the differential pair consisting of transistors Q1 and Q2 is a comparator with a very small gain, it has characteristics such that the output with respect to the differential input signal does not change sharply. In order to reduce the gain of this differential pair, resistors R1 and R2 are each provided with values on the order of 100Ω for a bias current Ib of 70 μA, for example.

Figure 4:
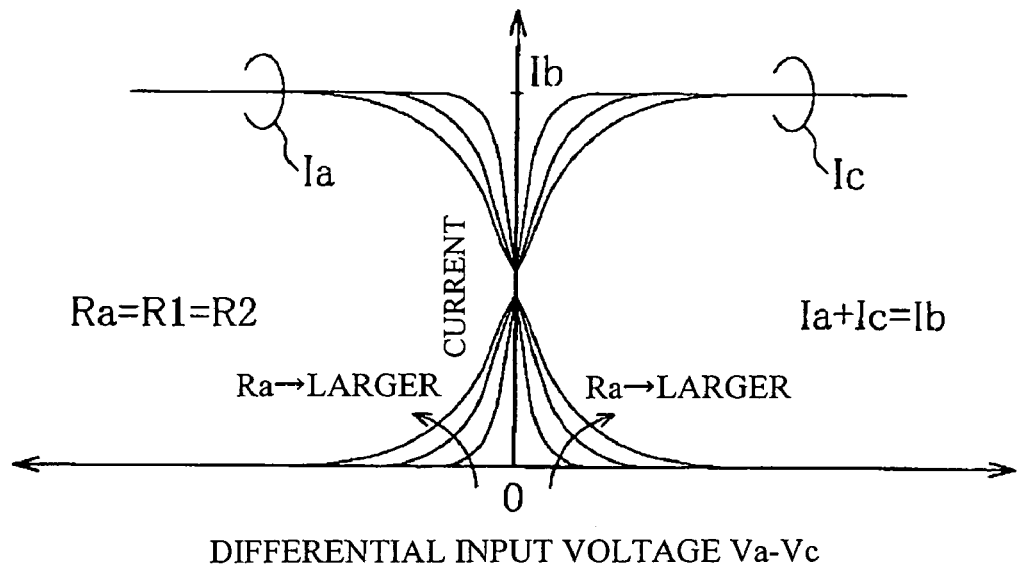
FIG. 4 shows a characteristics chart of the frequency output circuit of the first embodiment during current limitation.

FIG. 4 schematically shows the Va–Vc dependency of Ia and Ic. As shown in FIG. 4, as the resistance Ra increases, the switching between currents Ia and Ic becomes more gradual. Output current If is controlled by the current mirror circuit such that it is the same as current Ic. Thus, the time when current If flows and the time when it stops are gradually switched.

With reference to the circuit diagram shown in FIG. 3, the relationship between current If and voltages Va and Vc is described. Since the sum of currents Ia and Ib is equal to bias current Ib, the following equation (2) holds:

$$Ia + Ic = Ib \quad (2)$$

The relationship between input voltages Va and Vc to the differential pair circuit consisting of transistors Q1 and Q2 and currents Ia and Ic is expressed by the following equation (3):

$$Va - Vc = Vt \times \mathrm{Log}(Ic/Ia) + Ra \times (Ic - Ia) \quad (3)$$

where Vt is a thermal electromotive force, which is approximately 26 mV at 25° C.

Since Ic and If are equal because of the current mirror circuit consisting of transistors Q3 and Q4, the following equation (4) holds:

$$Ic = If \quad (4)$$

From equations (2), (3), and (4), the relationship between If and Va and Vc can be expressed by the following equation (5):

$$If = (Ib - If) \times \mathrm{Exp}((Va - Vc + Ra \times (Ib - 2 \times If))/Vt) \quad (5)$$

Because equation (5) includes If on both sides, a convergent calculation is carried out on a computer to determine the value.

Figure 2:
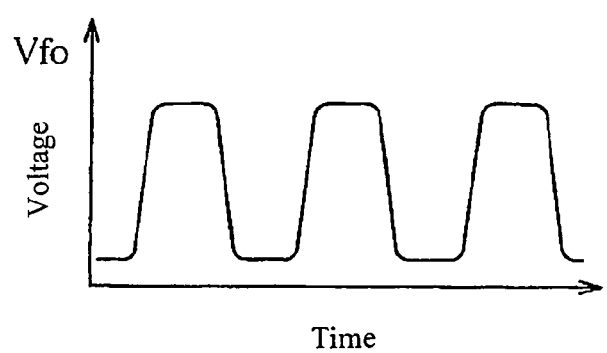
FIG. 2 shows an output characteristics chart of the frequency output circuit according to the first embodiment of the invention.

When Va is a frequency signal and Vc is a constant voltage, the switching of the output voltage Vfo can be made to take place gradually, as shown in FIG. 2, by increasing the value of Ra and thereby resulting in the output characteristics of the differential pair, which consists of transistors Q1 and Q2 and which is a comparator with a very small gain, such that the output in response to a differential input signal is not sharply switched. In this way, high-frequency components can be eliminated from the frequency output waveform and a waveform close to a sine wave can be obtained, as shown in FIG. 2, whereby the influence of radio noise can be reduced.

Thus, in accordance with the present embodiment, unwanted electromagnetic waves can be eliminated in a frequency output circuit having an open-collector output terminal, thereby reducing radio noise.

Figure 5:
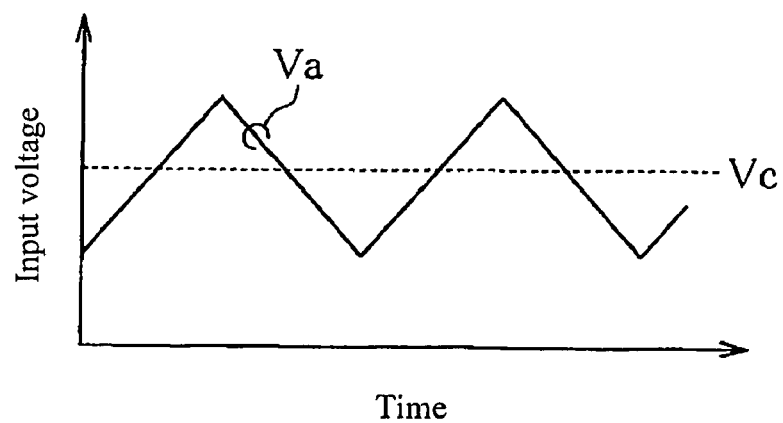
FIG. 5 shows an operational chart of the frequency output circuit according to a second embodiment of the invention.

With reference to FIGS. 1 and 5, the configuration of the frequency output circuit in accordance with the second embodiment of the invention is described.

FIG. 5 shows the operation of the frequency output circuit in the second embodiment of the invention.

The present embodiment characteristically comprises a triangular wave conversion circuit 18, as shown in FIG. 1. The path directly leading from the output circuit 12 to the current limiting circuit 16 is removed. The triangular wave conversion circuit 18 converts the output of the output circuit 12, if it is a rectangular wave, into a triangular wave, as shown in FIG. 5.

If Va is an ideal rectangular wave where the voltage switching time is zero, the switching of the output voltage Vfo would also be sharp, as will be seen from FIG. 4 and equation (5). This is due to the fact that the switching from Va<<Vc to Va>>Vc would be fast and it would take only a short time before Va≈Vc. Although such an ideal rectangular wave does not generally occur, the closer the voltage is to the ideal rectangular wave, the faster the switching becomes. Accordingly, by converting a rectangular wave into a triangular wave using the triangular wave conversion circuit 18, a time when Va≈Vc can be provided before and after the time when Va=Vc in FIG. 5, so that the switching of the output voltage Vfo can be made to take place gradually. In this way, high-frequency components can be eliminated from the frequency output waveform and a waveform close to a sine wave can be obtained, thereby reducing the noise influence on radio, for example.

While the triangular wave conversion circuit 18 has been separately provided, the output circuit 12 per se may be configured such that it produces a triangular wave output.

In accordance with the above-described embodiment, unwanted electromagnetic waves can be eliminated in a frequency output circuit having an open-collector output terminal, so that radio noise can be reduced.

Figure 6:
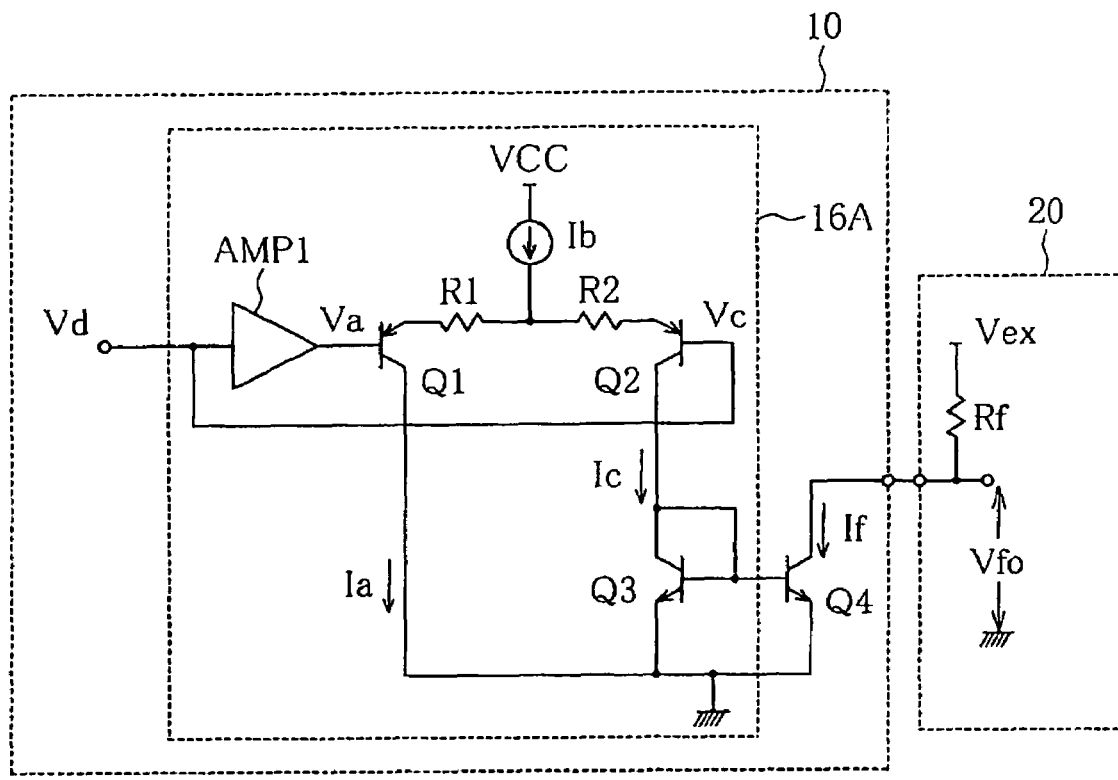
FIG. 6 shows a circuit diagram illustrating the configuration of the frequency output circuit according to a third embodiment of the invention.
Figure 7:
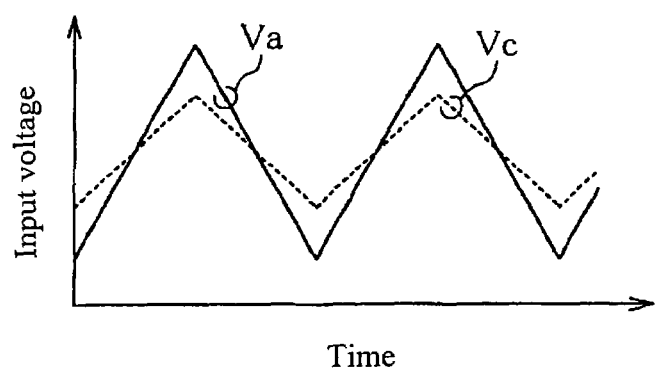
FIG. 7 shows an operational waveform chart of the frequency output circuit of the third embodiment.

With reference to FIGS. 6 and 7, the configuration of the frequency output circuit according to a third embodiment will be described.

FIG. 6 shows a circuit diagram illustrating the configuration of the frequency output circuit according to the third embodiment of the invention. FIG. 7 shows an operational waveform chart of the frequency output circuit of the third embodiment. Similar reference numerals designate similar elements in FIGS. 1 and 3.

A current limiting circuit 16A includes an amplifier AMP1 connected to transistor Q1, in addition to having the configuration shown in FIG. 3. An input signal Vd transmitted to the current limiting circuit 16A is a frequency signal of a triangular wave. The frequency signal Vd of the triangular wave has its amplitude changed by being amplified by the amplifier AMP1 before being fed to the base of transistor Q1. The frequency signal Vd of the triangular wave is also directly fed to the base of transistor Q2 as a reference signal Vc.

The relationship between voltages Va and Vc applied to the differential pair consisting of transistors Q1 and Q2 is as shown in FIG. 7. Thus, the voltages Va and Vc applied to the differential pair are both triangular waves and they gradually vary, such that the time it takes for them to be approximately equal can be further increased. As a result, the switching of output voltage Vfo can be made to take place gradually. In this way, high-frequency components can be eliminated from the frequency output waveform and a waveform close to a sine wave can be obtained, whereby the noise influence on radios, for example, can be reduced.

As described above, in accordance with the present embodiment, the switching of the output voltage can be made to take place gradually, whereby unwanted electromagnetic waves can be eliminated and radio noise can be reduced.

Figure 8:
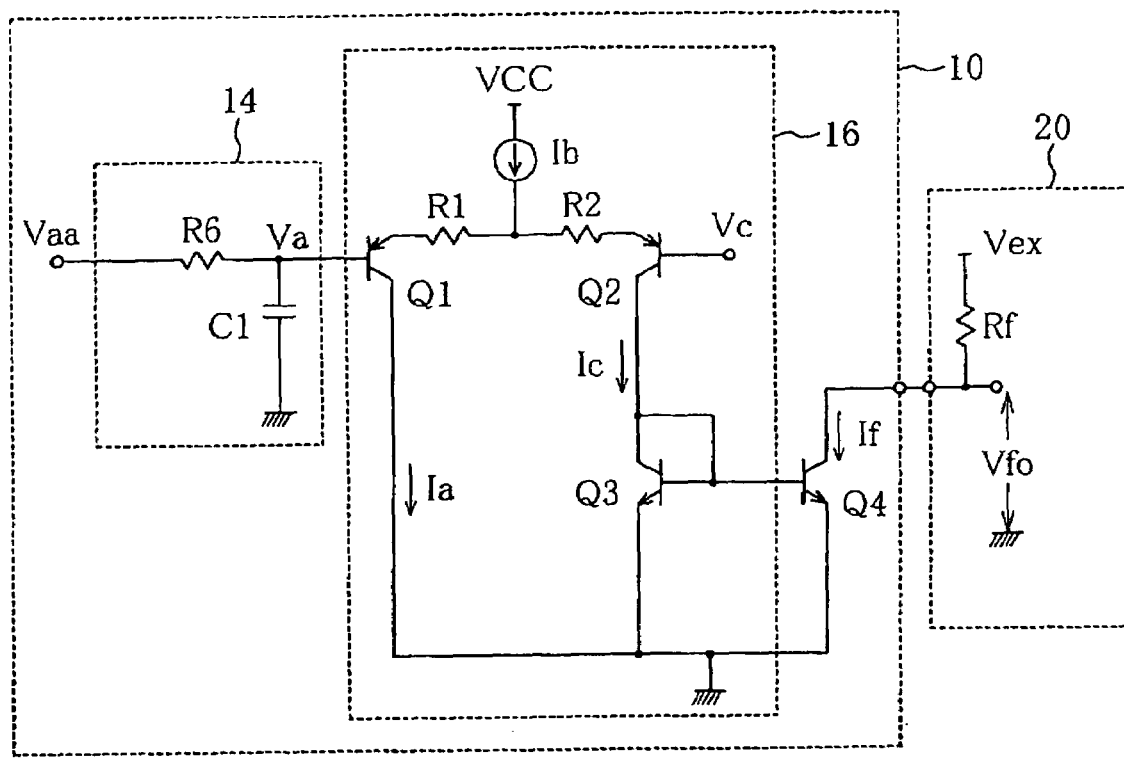
FIG. 8 shows a circuit diagram illustrating the configuration of the frequency output circuit according to a fourth embodiment of the invention.
Figure 9:
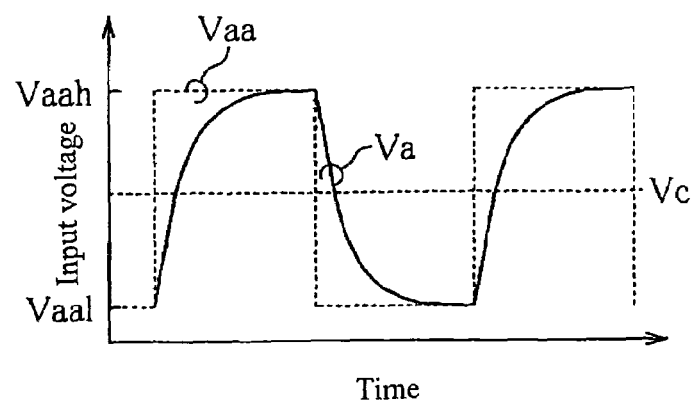
FIG. 9 shows an operational waveform chart of the frequency output circuit of the fourth embodiment.

With reference now to FIGS. 8 and 9, the configuration of the frequency output circuit according to a fourth embodiment of the invention will be described.

FIG. 8 shows a circuit diagram illustrating the configuration of the frequency output circuit of the fourth embodiment. FIG. 9 shows an operational waveform chart of the frequency output circuit of the fourth embodiment. Similar reference characters indicate similar elements in FIGS. 1 and 3.

The present embodiment includes a low-pass filter 14 in addition to the configuration shown in FIG. 3. The low-pass filter 14 consists of a resistor R6 and a capacitor C1. By supplying a rectangular wave output signal Vaa from output circuit 12 to the base of transistor Q1 via low-pass filter 14, the condition whereby Va≈Vc can be maintained over time.

FIG. 9 shows the relationship between the frequency rectangular wave signal Vaa and the frequency signal Va fed to the differential pair. When the time at which rectangular wave Vaa is switched from a low voltage Vaal to a high voltage Vaah is zero, Va fed to the differential pair is expressed by the following equation (6), in which the current that flows through the base of Q1 is ignored:

$$Va=(Vaah-Vaal)\times(1-\mathrm{Exp}(-t/(C1\times R6)))+Vaal \qquad (6)$$

In equation (6), as (C×R) increases, the time it takes for Va to be switched from Vaal to Vaah increases. When the time at which the rectangular wave Vaa is switched from a high voltage Vaah to a low voltage Vaal in FIG. 9 is zero, Va fed to the differential pair is expressed by the following equation (7), in which the current that flows through the base of Q1 is ignored:

$$Va=(Vaah-Vaal)\times\mathrm{Exp}(-t/(C1\times R6))+Vaal \qquad (7)$$

In equation (7), as (C×R) increases, the time it takes for Va to be switched from Vaah to Vaal increases.

Thus, in accordance with the present embodiment, the switching of output voltage is made to take place gradually by blunting the signal shape of a rectangular wave signal using a low-pass filter, whereby unwanted electromagnetic waves can be eliminated and radio noise can be reduced.

Figure 10:
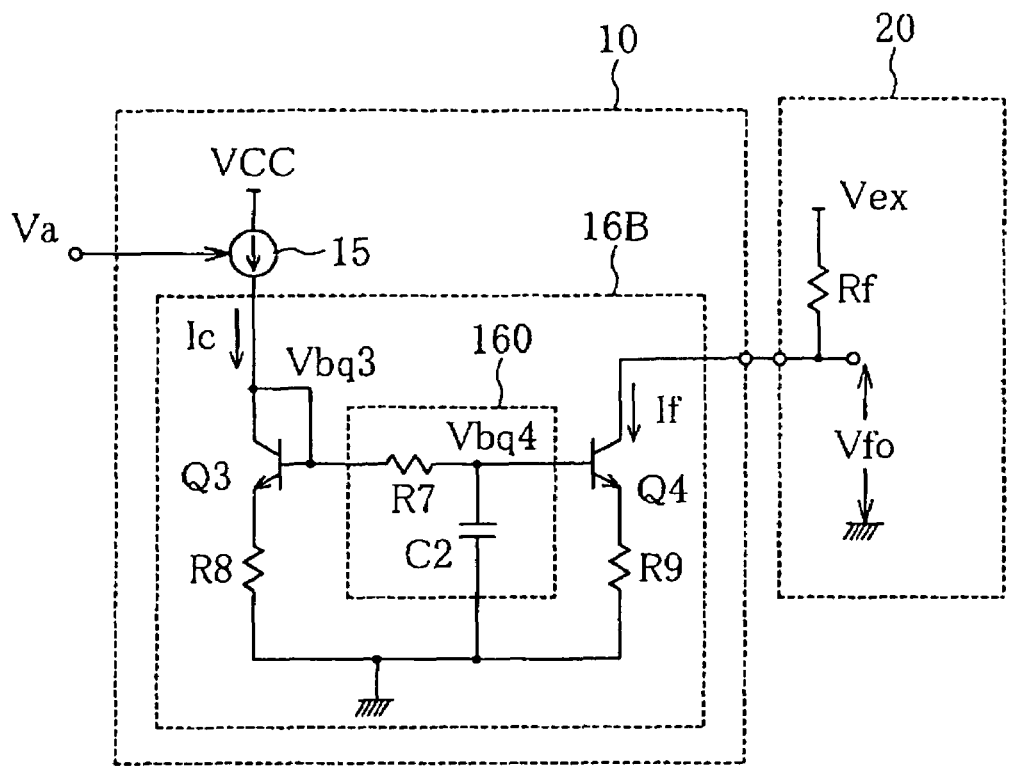
FIG. 10 shows a circuit diagram illustrating the configuration of the frequency output circuit according to a fifth embodiment of the invention.
Figure 11:
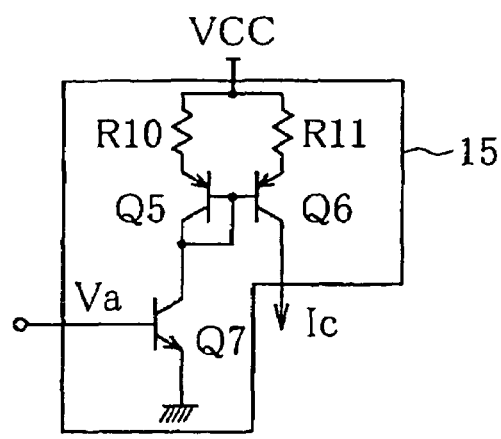
FIG. 11 shows a circuit diagram of a current source used in the frequency output circuit of the fifth embodiment.

Referring to FIGS. 10 and 11, the configuration of the frequency output circuit according to a fifth embodiment of the invention will be described.

FIG. 10 shows a circuit diagram illustrating the configuration of the frequency output circuit according to the fifth embodiment. FIG. 11 shows a circuit diagram of a current source used in the frequency output circuit according to the fifth embodiment. Similar reference characters indicate similar elements in FIGS. 1 and 3.

As shown in FIG. 10, a current limiting circuit 16B comprises a current mirror circuit having a low-pass filter 160 consisting of a capacitor C2 and a resistor R7. The current source 15 outputs a current Ic in the form of a rectangular wave in accordance with the rectangular wave voltage signal Va. The current source 15 is configured as shown in FIG. 11, for example.

Referring to FIG. 11, to the base of transistor Q7, a rectangular wave voltage signal Va is applied. The current source 15 operates as follows. No current flows through R10 when transistor Q7 is turned off. The current that flows through R10 of current source 15, or I10, when transistor Q7 is turned on, is expressed by the following equation (8):

$$I10 = (VCC - Vbe5 - Vce7)/R10 \quad (8)$$

where Vbe5 is the base-emitter voltage of transistor Q5, and Vce7 is the emitter-collector voltage of transistor Q7.

Transistor Q5 forms a pair with transistor Q6 to constitute a current mirror circuit. As current I10 flows through resistor R10, current I11 flows through resistor R11.

The relationship between I10 and I11 is expressed by the following equation (9):

$$R10 \times I10 - R11 \times I11 = Vt \times \log(I11/I10) \quad (9)$$

where Vt, which is a thermal electromotive force, is approximately 26 mV at 25° C.

From equation (9), I10=I11 when R10=R11.

In FIG. 10, current Ic that flows from current source 15 to transistor Q3 is the same as current I11 that satisfies equation (9), and the current that flows through Q3 is zero or a rectangular wave current of Ic. When Ic flows through Q3, the base potential Vbq3 of Q3 is expressed by the following equation (10)

$$Vbq3 = Ic \times R8 + Vbe3 \quad (10)$$

where Vbe3 is the base-emitter voltage of Q3.

When Ic=0, Vbq3=0, so that Vbq3 is a rectangular wave. If the time at which Vbq3 switches from zero to potential Vbq3h when the current Ic has flowed is zero, Vbq4 inputted to the base of open-collector transistor Q4 is expressed by the following equation (11):

$$Vbq4 = Vbq3h \times (1 - \mathrm{Exp}(-t/(C2 \times R7))) \quad (11)$$

where the current that flows through the base of Q4 is ignored.

In equation (11), as (C2×R7) increases, the time before Vbq4 switches from zero to Vbq3h becomes longer. Further, if the time at which Vbq3 switches from Vbq3h to zero is zero, Vbq4, which is inputted to the base of the open-collector transistor Q4, is expressed by the following equation (12):

$$Vbq4 = Vbq3h \times \mathrm{Exp}(-t/(C2 \times R7)) \quad (12)$$

where the current that flows through the base of Q4 is ignored.

In equation (12), as (C2×R7) increases, the time it takes for Vbq4 to be switched from Vbq3h to zero becomes longer. Current If that flows through the open-collector transistor Q4 is expressed by the following equation (13):

$$If = (Vbq4 - Vbe4)/R9 \quad (13)$$

where Vbe4 is the base-emitter voltage of open-collector transistor Q4.

From equation (13), as the input Vbq4 to the base of open-collector transistor Q4 varies gradually, the current If that flows through open-collector transistor Q4 also gradually varies, so that the switching of output voltage can be made to take place gradually.

Alternatively, instead of the current source 15 that outputs a rectangular wave current Ic in accordance with rectangular wave voltage signal Va, a current source that outputs a triangular wave current or a rectangular wave signal current that has been blunted, as in the output of the low-pass filter shown in FIG. 9, may be employed.

Thus, in accordance with the present embodiment, a current mirror circuit is provided with a low-pass filter whereby the switching of output voltage can be made to take place gradually. As a result, unwanted electromagnetic waves can be eliminated and radio noise can be reduced.

Figure 12:
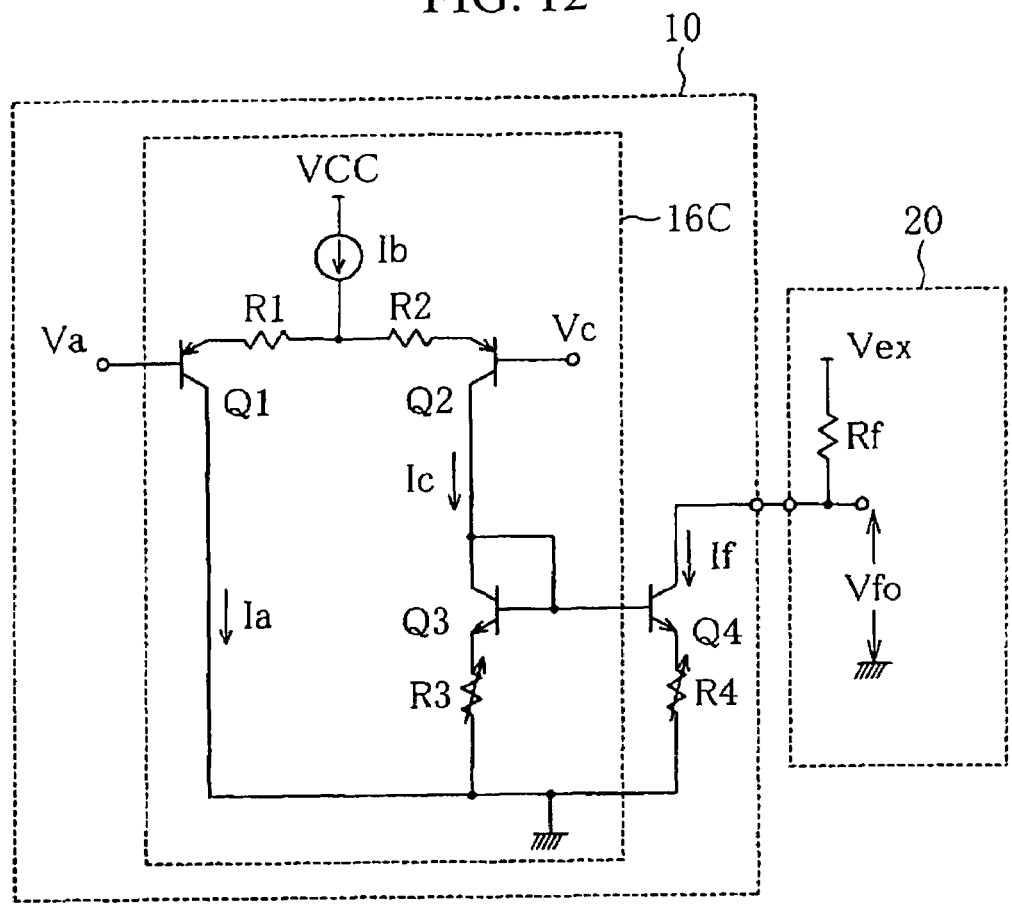
FIG. 12 shows a circuit diagram illustrating the configuration of the frequency output circuit according to a sixth embodiment of the invention.
Figure 13:
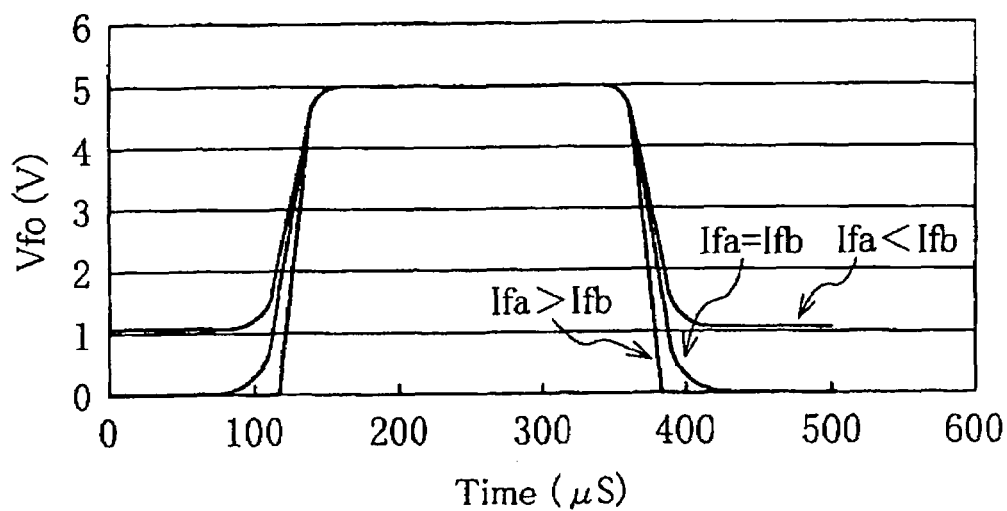
FIG. 13 shows an operational waveform chart of the frequency output circuit of the sixth embodiment.

With reference to FIGS. 12 and 13, the configuration of the frequency output circuit according to a sixth embodiment of the invention will be described.

FIG. 12 shows a circuit diagram illustrating the configuration of the frequency output circuit in the sixth embodiment. FIG. 13 shows an operational waveform chart of the frequency output circuit in the sixth embodiment. Similar reference characters indicate similar elements in FIGS. 1 and 3.

In the present embodiment, a current limiting circuit 16C includes adjusting resistors R3 and R4 for the emitter of open-collector transistor Q4 and for the emitter of transistor Q3, in addition to having the configuration shown in FIG. 3.

Referring to FIG. 12, Ifa designates the current through open-collector transistor Q4 that is calculated from current Ic through transistor Q3. Ifb designates the current that actually flows. Current Ifa can be adjusted by varying the values of adjusting resistors R3 and R4 such that the following equation (14) is satisfied:

$$Ifa \times R4 - Ic \times R3 = Vt \times \log(Ic/Ifa) \quad (14)$$

where Ifa indicates the current that can be caused to flow in open-collector transistor Q4. The current Ifb that actually flows is expressed by the following equation (15):

$$Ifb = (Vex - Vce4)/(Rf + R4) \quad (15)$$

Depending on the relative magnitude of Ifa and Ifb as calculated from equation (14) and equation (15), respectively, the waveform of the frequency output voltage Vfo varies. In the following, the variation of the waveform of frequency output voltage Vfo is described with reference to FIG. 13.

When Ifa>Ifb, Vfo does not smoothly vary in the vicinity of 0V, which undesirably results in an increase in electromagnetic wave radiation. When Ifa=Ifb, the output voltage on the lower voltage side varies smoothly until Vfo=0. On the other hand, when Ifa<Ifb, although the voltage smoothly drops to the output voltage on the lower voltage side, it does not drop to 0V.

As will be seen from equation (15), Ifb varies depending on Vex of the power supply of an external circuit that receives a frequency signal and the pull-up resistor Rf. Thus, by making Ifa adjustable, any power supply Vex or pull-up resistor Rf can be accommodated, so that it becomes possible to output an optimum frequency signal. The adjustment of the resistance values of resistors R3 and R4 is made by resistance trimming, for example, such that they can function as fixed resistors after adjustment.

Thus, in accordance with the present embodiment, by providing the current mirror circuit with an adjusting resistor, the switching of the output voltage can be made to take place gradually, whereby unwanted electromagnetic waves can be eliminated and radio noise can be reduced.

Figure 14:
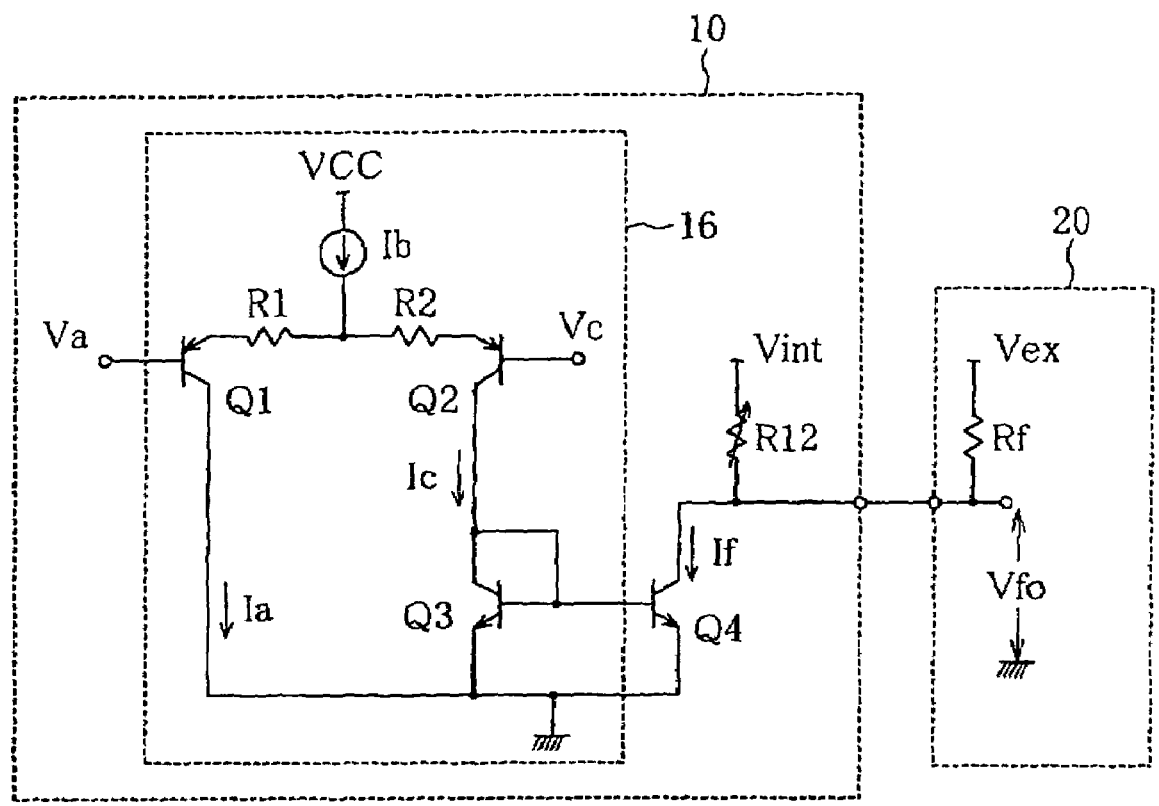
FIG. 14 shows a circuit diagram illustrating the configuration of the frequency output circuit according to a seventh embodiment of the invention.

Referring to FIG. 14, the configuration of the frequency output circuit according to a seventh embodiment of the invention will be described.

FIG. 14 shows a circuit diagram illustrating the configuration of the frequency output circuit of the seventh embodiment. Similar reference characters indicate similar elements in FIGS. 1 and 3.

In the present embodiment, an adjustable pull-up resistor R12 is connected to between a power supply Vint and the collector of transistor Q4. The pull-up resistor R12 is adjusted such that a current corresponding to Ifa−Ifb would flow in R12, thereby preventing the relationship Ifa>Ifb and causing output voltage Vfo to vary smoothly even if it is near zero. Although the current that flows through the open collector increases as compared with the case where the internal voltage Vint and pull-up resistor R12 are not provided, the current that flows through the wire connecting the frequency oscillating circuit and the external circuit receiving the frequency signal does not increase. Electromagnetic wave radiation from wires, which is a problem, can be reduced by the present method.

Thus, in accordance with the present embodiment, an adjustable pull-up resistor is provided whereby the switching of output voltage can be made to take place gradually. As a result, electromagnetic wave radiation from wires can be reduced, in addition to eliminating unwanted electromagnetic waves and reducing radio noise.

By employing the output circuit according to any of the above-described embodiments, the output of a hot-wire airflow meter of the frequency output type can be adjusted in a nonlinear manner without using a compensating LSI or microcomputer.

What is claimed is:

1. A frequency output circuit comprising an output circuit that outputs a rectangular wave signal, and an open-collector transistor whose collector is an output terminal, the collector being connected to a pull-up resistor connected to an external power supply, the output terminal outputting a frequency signal with the same frequency as a frequency of a signal outputted from the output circuit, and the frequency output circuit further comprising:

a current limiting circuit for limiting a current that flows through the output terminal such that a high potential and a low potential of an output waveform outputted via the output terminal are smoothly switched, wherein the current limiting circuit comprises:

a differential pair circuit having a first transistor with a resistor provided to the emitter thereof, and a second transistor with a resistor provided to the emitter thereof;

a third transistor that forms a current mirror circuit with the open-collector transistor, the third transistor being connected to the collector of one of the first transistor and the second transistor; and a constant current source configured to distribute currents to the first transistor and the second transistor through the resistors that are connected to the emitters of the first transistor and the second transistor respectively, based on a difference between the input signal inputted to the base of the first transistor and an input signal inputted to the base of the second transistor.

2. The frequency output circuit according to claim 1, wherein the transistors forming the current mirror circuit in the current limiting circuit each have an adjusting resistor connected to the emitter thereof.

3. The frequency output circuit according to claim 1, wherein signals inputted to the differential pair circuit of the current limiting circuit comprise a triangular wave voltage signal with the same frequency as that of an output signal, and a constant voltage signal with a value between a maximum voltage value and a minimum voltage value of the triangular wave.

4. The frequency output circuit according to claim 1, wherein signals inputted to the differential pair circuit of the current limiting circuit comprise two kinds of triangular wave voltage signals with the same frequency as that of an output signal and with different amplitudes.

5. The frequency output circuit according to claim 1, wherein the differential pair circuit of the current limiting circuit comprises a low-pass filter formed by a capacitor and a resistor at a signal input terminal thereof.

6. The frequency output circuit according to claim 1, further comprising another pull-up resistor connected to the open-collector output terminal and also connected to an internally provided reference power supply.

* * * * *